United States Patent [19]
Sakurai et al.

[11] Patent Number: 5,384,548
[45] Date of Patent: Jan. 24, 1995

[54] CONSTANT TRANSCONDUCTANCE BIAS CIRCUIT AND METHOD

[75] Inventors: Satoshi Sakurai; Mohammed Ismail, both of Columbus, Ohio

[73] Assignee: The Ohio State University, Columbus, Ohio

[21] Appl. No.: 111,708

[22] Filed: Aug. 25, 1993

[51] Int. Cl.⁶ .............................................. H03F 3/45
[52] U.S. Cl. ...................................... 330/253; 330/261
[58] Field of Search ............... 330/253, 254, 257, 258, 330/261

[56] References Cited

U.S. PATENT DOCUMENTS 5,142,244  8/1992  Glica et al. ................... 330/253 X

OTHER PUBLICATIONS

CMOS Low-Voltage Operational Amplifiers with Constant-$G_M$ Rail-to-Rail Input Stage; IEEE, 1992, pp. 2876–2879.

Primary Examiner—Steven Mottola
Attorney, Agent, or Firm—Bell, Seltzer, Park & Gibson

[57] ABSTRACT

The reduction of the power supply voltage of VLSI circuits to 3.3 volts results in a significant loss in input and output swing in traditional CMOS analog circuits. In order to achieve rail-to-rail operation, n-channel and p-channel MOSFETs are placed in parallel so that at least one type of transistors are operating in a high gain region throughout the entire input range. However, circuit characteristics change as transistors turn on and off. A constant transconductance bias means enables the rail-to-rail CMOS differential stage to possess a constant transconductance over the entire common mode voltage range. Significantly, the bias circuit does not require any matching between the transistors of opposite types.

22 Claims, 6 Drawing Sheets

CONSTANT TRANSCONDUCTANCE BIAS CIRCUIT AND METHOD

FIELD OF THE INVENTION

This invention relates to integrated circuit devices, and more particularly to bias circuits for integrated circuit devices.

BACKGROUND OF THE INVENTION

As very large scale integrated (VLSI) circuits move toward a lower 3.3 volt power supply voltage, conventional analog complementary metal oxide semiconductor (CMOS) circuits lose a significant amount of operating range. One of the more commonly used analog circuits which is most strongly affected by the reduced power supply is an input stage differential pair of an operational amplifier (opamp). The input stage differential pair of an opamp may have a common mode input range of only half of the full power supply range.

Figure 1:
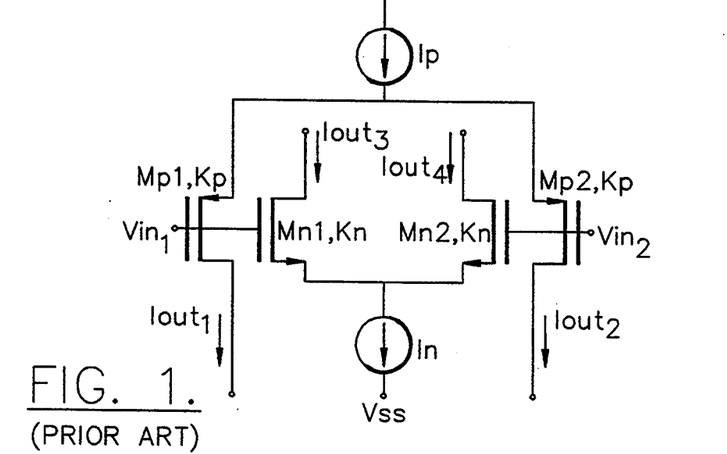
FIG. 1 illustrates a conventional CMOS rail-to-rail differential input stage.

A rail-to-rail CMOS differential input stage, as shown in FIG. 1, is commonly used to take advantage of the entire 3.3 volt input range and provides at least one output signal which is a function of the first and second input voltage signals. This conventional input stage includes a first pair of field effect transistors (FETs) $M_{n1}$, $M_{n2}$ of one conductivity type, connected in parallel with a second pair of FETs $M_{p1}$, $M_{p2}$ of an opposite conductivity type. The subscript "n" denotes n-type conductivity, and the subscript "p" denotes p-type conductivity. A first differential input, $V_{in1}$, is connected to the gates of FETs $M_{p1}$ and $M_{n1}$, and a second differential input, $V_{in2}$, is connected to the gates of FETs $M_{p2}$ and $M_{n2}$. The drains of the p-type FETs furnish two current outputs $I_{out1}$ and $I_{out2}$, and the drains of the n-type FETs supply two more current outputs $I_{out3}$ and $I_{out4}$. A constant bias current, $I_p$, flows from the reference voltage source $V_{dd}$ into the sources of the p-type FETs $M_{p1}$ and $M_{p2}$. Another constant bias current, $I_n$, flows from the sources of the n-type FETs $M_{n1}$ and $M_{n2}$. The output current of the circuit is:

$$I_{out}=I_{outp}-I_{outn}=-V_{in}(g_{mn}+g_{mp})=-V_{in}g_{mT}$$

where $g_{mT}$, the total transconductance, is:

$$g_{mT}=g_{mn}+g_{mp}$$

where $g_{mn}$ is the transconductance of the n-type FETs, and $g_{mp}$ is the transconductance of the p-type FETs.

The output currents of the differential pairs, $I_{outp}$ and $I_{outn}$, are defined by:

$$I_{outp}=I_{out1}-I_{out2}=-g_{mp}V_{in}$$
$$I_{outn}=I_{out3}-I_{out4}=g_{mn}V_{in}$$

Unfortunately, however, for fixed bias currents $I_p$ and $I_n$, the transconductance, $g_m$, of the input stage varies by at least a factor of two over the common mode range. The frequency compensation is therefore more complicated, and the frequency response is limited, because the unity gain frequency of the opamp is proportional to the transconductance of the input stage. A constant transconductance, on the other hand, ensures a steady unity gain frequency within the whole common mode input range.

For an n-type MOS transistor operating in the saturation region, the drain current equation is:

$$I_d = K(V_{gs}-V_T)^2 \qquad (1)$$

where, $V_{gs}$, is the transistor's gate to source voltage;
$V_T$, is the transistor's threshold voltage; and
K, the device transconductance parameter, $=\mu C_{ox}W/2L$;
  where, $C_{ox}$, is the capacitance of the gate oxide;
  W, is the channel width; and
  L, is the channel length.

Significantly, the mobility $\mu$ of an electron is 2 to 3 times larger than that of a hole. Thus, if one wishes to obtain similar current to voltage characteristics from both an n-type MOSFET and a p-type MOSFET, the size of the p-channel transistor must be 2 to 3 times that of the n-channel transistor. The transconductance of a transistor with $K_i$ and $I_d$ is:

$$g_m = \sqrt{4K_iI_d} \qquad (2)$$

The total transconductance, $g_{mT}$, of the circuit in FIG. 1 is thus:

$$g_{mT} = \sqrt{2K_nI_n} + \sqrt{2K_pI_p} \qquad (3)$$

Where $K_nI_n$ is the device transconductance parameter and current, respectively, in the n-channel transistors and $K_pI_p$ is the device transconductance parameter and current, respectively, in the p-channel transistors. Both terms on the right side of equation (3) are constant for only a small region of the common mode range because the current sources will be pushed into the triode region as the input voltage moves toward the supply rails.

The conventional approach using equation (1) in designing a constant $g_m$ input stage, as in FIG. 1, was to assume that n-channel and p-channel transistors can be matched ($K_n=K_p$ can actually be achieved). If so, then equation (3) can be rewritten as:

$$g_{mT} = \sqrt{K_n + K_p}(\sqrt{I_n} + \sqrt{I_p}) \qquad (4)$$

In the past, a dynamic bias circuit which maintains the sum of the square-roots of $I_n$ and $I_p$ was used to keep the circuit's $g_{mT}$ constant. For a review of this type of design, see, R. Hogervorst, R. J. Wiegerinkk, P. A. de Jong, J. Fonderie, R. F. Wassenaar, and J. H. Huijsing, "CMOS low-voltage operational amplifiers with constant-$g_m$ rail-to-rail input stage," *Proceedings of the IEEE International Symposium on Circuits and Systems*, pp. 2876–2879 (1992). The major disadvantage of this variety of circuits is that the matching of transistors of opposite conductivity types is assumed. In reality, the $K_n/K_p$ ratio can vary by more than 20% between transistor fabrication runs within the same batch process.

SUMMARY OF THE INVENTION

It is therefore an object of the present invention to provide an integrated circuit differential stage that can produce a constant transconductance over a large input voltage range.

It is another object of the invention to provide a differential stage that does not require matching transistors of p-type conductivity with transistors of n-type conductivity.

These and other objects according to the present invention are provided by a dynamic bias circuit which can be used to source or sink currents into the n-channel and p-channel differential pair combination to maintain a constant transconductance in a differential stage without n-channel to p-channel matching requirements. More particularly, an integrated circuit includes a differential stage with a first and second differential pair of FETs of opposite conductivity types connected in parallel. A first bias current flows through the first differential pair of FETs and a second bias current flows through the second differential pair of FETs. Constant transconductance bias means is connected to the differential stage for monitoring one of the first and second bias currents and for dynamically controlling the other of the first and second bias currents so that the transconductance of the differential stage is kept constant.

The monitored bias current is a common mode voltage-dependent current and flows though the differential pair of FETs of p-type conductivity. The dynamically controlled bias current is supplied by the constant transconductance bias means and flows through the differential pair of FETs of n-type conductivity. However, the monitored bias current may flow through the differential pair of FETs of n-type conductivity, with the dynamically controlled bias current flowing through the differential pair of FETs of p-type conductivity.

A first current source is preferably coupled to the constant transconductance bias means for limiting the dynamically controlled bias current when the FETs through which the monitored bias current flows are operating in a weak inversion region. Similarly, a second current source is preferably coupled to the constant transconductance bias means for limiting the monitored bias current when the FETs through which the dynamically controlled bias current flows are operating in a weak inversion region. The constant transconductance bias means preferably maintains a ratio of the first current source to the second current source equal to a predetermined constant value. The predetermined constant value is preferably equal to the ratio of the device transconductance parameter of the FETs through which the monitored bias current flows and the device transconductance parameter of the FETs through which the dynamically controlled bias current flows.

A bias circuit and method which can provide a constant transconductance according to the invention has several significant advantages. First, the unity gain frequency of an opamp is proportional to transconductance, thus a constant transconductance bias circuit ensures a steady unity gain frequency within the common mode input range, thereby extending the frequency response. Second, frequency compensation is less complicated without the need to compensate for a shifting transconductance. Third, the constant transconductance bias circuit does not require matching of p-channel and n-channel transistors.

DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein; rather these embodiments are provided so that this disclosure will be thorough and complete, and will fully convey the scope of the invention to those skilled in the art. Like numbers refer to like elements in alternate embodiments throughout.

Figure 2:
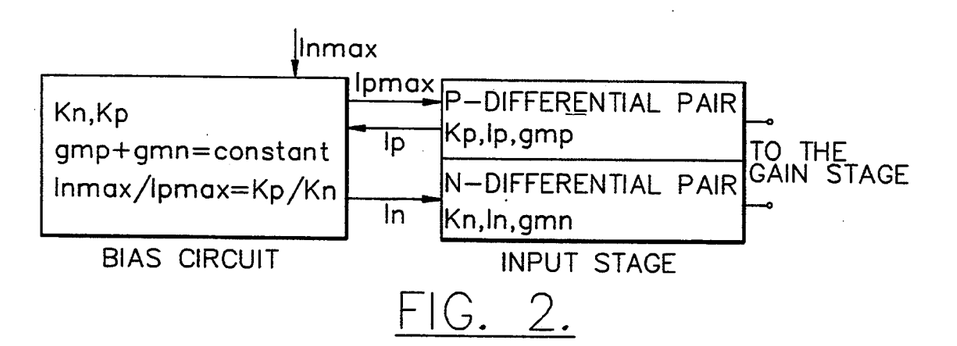
FIG. 2 illustrates a block diagram of a constant transconductance input stage according to the invention.

According to the invention, a constant transconductance bias circuit is obtained without requiring any matching of transistors of opposite conductivity types by using the relationships of equation (3). The input to the dynamic bias circuit, illustrated in FIG. 2 in block diagram form, is a common mode voltage-dependent current, $I_p$, which flows through the p-channel differential pair. The output of the dynamic bias circuit is a dynamically controlled current, $I_n$, which is delivered to the n-channel differential pair. $I_{nmax}$ and $I_{pmax}$ are also an input and output, respectively, of this circuit. $I_{nmax}$ and $I_{pmax}$ are constant currents that are used for circuit operation when the transistors enter the weak inversion region, which is discussed in further detail below. Note that the dynamic bias circuit presented here works equally well regardless of whether $I_n$ or $I_p$ is the bias circuit input. FIG. 2 assumes that $I_p$ is the input.

The design approach is as follows. First, equation (3) is divided by $\sqrt{2K_nK_p}$ to obtain the following:

$$\frac{g_{mT}}{\sqrt{2K_nK_p}} = \sqrt{\frac{I_n}{K_p}} + \sqrt{\frac{I_p}{K_n}} \tag{5}$$

It can be seen by observing the right hand side of equation (5) that a constant $g_{mT}$ may be obtained by keeping the sum of two gate to source voltages constant. In particular, a gate to source voltage ($V_{gs}$) of an NMOS FET with a current $I_p$ and a source to gate voltage ($V_{sg}$)

of a PMOS FET with a current $I_n$ are kept constant. The term $V_{gs}$ is used for n-channel transistors so that when a voltage is taken across the gate to the source it is a positive number. Similarly, $V_{sg}$ is used for p-channel transistors so that when a voltage is taken across the source to the gate it is a positive number.

Figure 3:
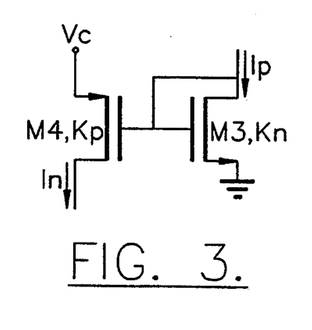
FIG. 3 illustrates an embodiment of a voltage controlled constant transconductance bias circuit according to the invention.

The circuit shown in FIG. 3 is one embodiment for keeping equation (5) constant. $V_c$ is the bias voltage which keeps the sum of $V_{sg4}$ (source to gate voltage of M4) and $V_{gs3}$ (gate to source voltage of M3) constant. If M3 and M4 have K values of $K_n$ and $K_p$, respectively, then they are the same K values as the input differential pair transistors. Hence, the only FET matching required remains within transistors of the same conductivity type. Therefore, the following is true at all times:

$$\sqrt{\frac{I_n}{K_p}} + |V_{Tp}| + \sqrt{\frac{I_p}{K_n}} + V_{Tn} = V_C \tag{6}$$

where $|V_{Tp}|$ is the absolute value of the p-channel threshold voltage; and $V_{Tn}$ is the n-channel threshold voltage.

Thus, for a given $V_c$ and a constant $|V_{Tp}|+V_{Tn}$, the right side of equation (5) is constant, and consequently $g_{mT}$ becomes constant.

Figure 4:
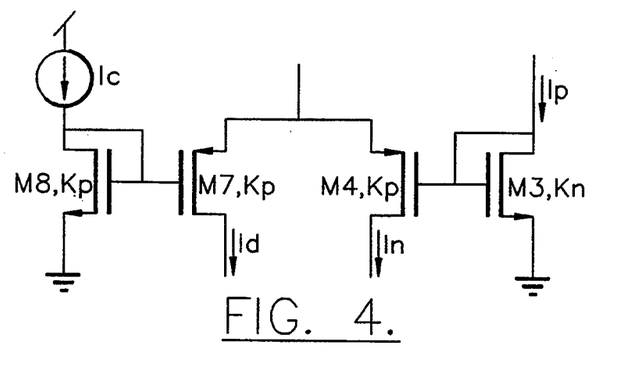
FIG. 4 illustrates an embodiment of a current controlled constant transconductance bias circuit according to the invention.

FIG. 4 illustrates a circuit similar to the one in FIG. 3, which uses current sources $I_c$ and $I_d$ as its biases. Realizing that the sum of $V_{sg7}$ and $V_{gs8}$ must equal $V_{sg4}+V_{gs3}$, results in the following relation:

$$\sqrt{\frac{I_c}{K_n}} + \sqrt{\frac{I_d}{K_p}} = \sqrt{\frac{I_n}{K_p}} + \sqrt{\frac{I_p}{K_n}} \tag{7}$$

Substituting equation (7) into equation (5) yields:

$$g_{mT} = \sqrt{2I_c K_p} + \sqrt{2I_d K_n} \tag{8}$$

Figure 5:
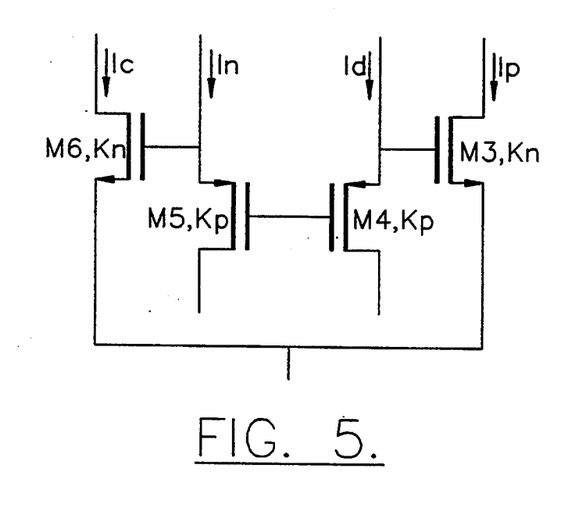
FIG. 5 illustrates a constant transconductance bias circuit with a low operation voltage according to the invention.

Another embodiment of a dynamic bias circuit according to the invention, shown in FIG. 5, has its largest voltage drop across one FET's gate to source voltage. The minimum voltage required for operation of this circuit is much smaller than the voltages required for the circuits in FIG. 3 or FIG. 4. However, the body effect on the two PMOS FETs M4, M5 must be taken into account in this case.

The above description assumed that the transistors will be operating in saturation and in the strong inversion region. According to equation (1), when $I_d$ equals zero, $V_{gs}$ equals $V_T$. In reality, as $V_{gs}$ approaches $V_T$, the transistor will enter the weak inversion region and equation (1) is no longer valid. Instead, as $I_d$ approaches zero, $V_{gs}$ will continuously decrease not to $V_T$, but to zero.

Figure 6:
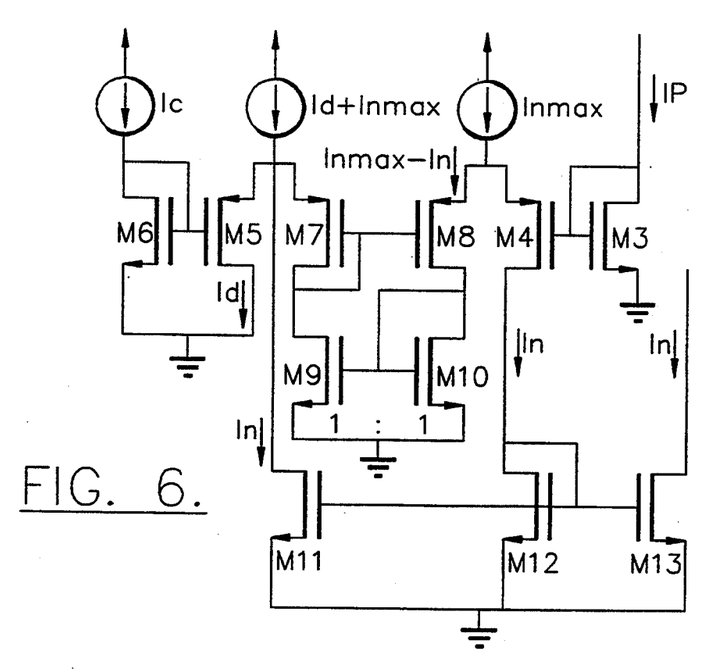
FIG. 6 illustrates a modified version of the current controlled constant transconductance bias circuit shown in FIG. 4.

The implication of this weak inversion behavior is given by the following example. In FIG. 3 when $I_p$ becomes zero, $V_{gs3}$ also becomes zero; then $V_{sg4}$ suddenly increases to $V_c$, not $V_c - V_T$ as predicted by equation (6). Accordingly, $I_n$ will be much larger than its intended value, and consequently the $g_{mT}$ will be very large. To prevent the unexpected increase in $I_n$, the circuit in FIG. 4 may be modified, with a resulting circuit shown in FIG. 6. A Current mirror M9, M10 forces FETs M7 and M8 to have the same drain current. Since FETs M7, M8 are the same size, the source voltages of M4 and M5 are equal; in FIG. 4, they were connected to the same node. The separation of the two nodes allows the circuit to source a constant current into the source terminals of M4 and M8. The current $I_{nmax}$ is then the maximum value of $I_n$. FET $M_{11}$ is used to sink current $I_n$ from the source terminal of M5 so that the current flowing through M5 is $I_d$.

When the common mode input voltage, $V_{cm}$, of the differential pairs in FIG. 1, is close to the positive rail, the current source supplying $I_p$ is cut off and $I_n$ becomes $I_{nmax}$. The total transconductance is then:

$$g_{mT} = \sqrt{2I_{nmax}K_n} \tag{9}$$

When $V_{in}$ is near the negative rail, the total transconductance is:

$$g_{mT} = \sqrt{2I_{pmax}K_p} \tag{10}$$

Where $I_{pmax}$ is the maximum value of $I_p$.

When none of the transistors is in the weak inversion region, the total transconductance, $g_{mT}$, is given by equation (8). Thus, equations (8), (9), and (10) must equal each other. Equation (9) equals equation (10), if the following is true:

$$\frac{I_{nmax}}{K_p} = \frac{I_{pmax}}{K_n} \tag{11}$$

Figure 7:
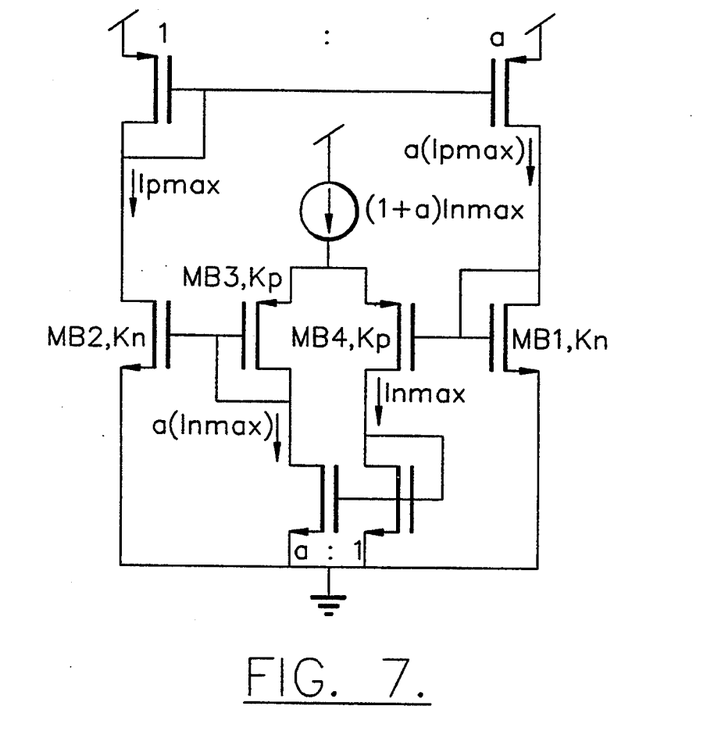
FIG. 7 illustrates a CMOS implementation of the $I_{nmax}/K_p = I_{pmax}/K_n$ relation.

Equation (11) can be implemented by utilizing the same technique used in FIG. 4; with the resulting circuit shown in FIG. 7. By equating the sums of gate to source voltages, the following can be written:

$$\sqrt{\frac{aI_{pmax}}{K_n}} + \sqrt{\frac{I_{nmax}}{K_p}} = \sqrt{\frac{aI_{nmax}}{K_p}} + \sqrt{\frac{I_{pmax}}{K_n}} \tag{12}$$

Equation (8) can be made equal to equations (9) and (10) by determining appropriate values of $I_c$ and $I_d$ in terms of $I_{nmax}$ and/or $I_{pmax}$. In particular, if for simplicity (but not necessarily), all NMOS FETs are the same size, and if all the PMOS FETs are the same size, then $I_c=I_{pmax}/4$ and $I_d=I_{nmax}/4$ are one set of solutions that satisfies equation (8) equaling equation (9) which equals equation (10).

Figure 8:
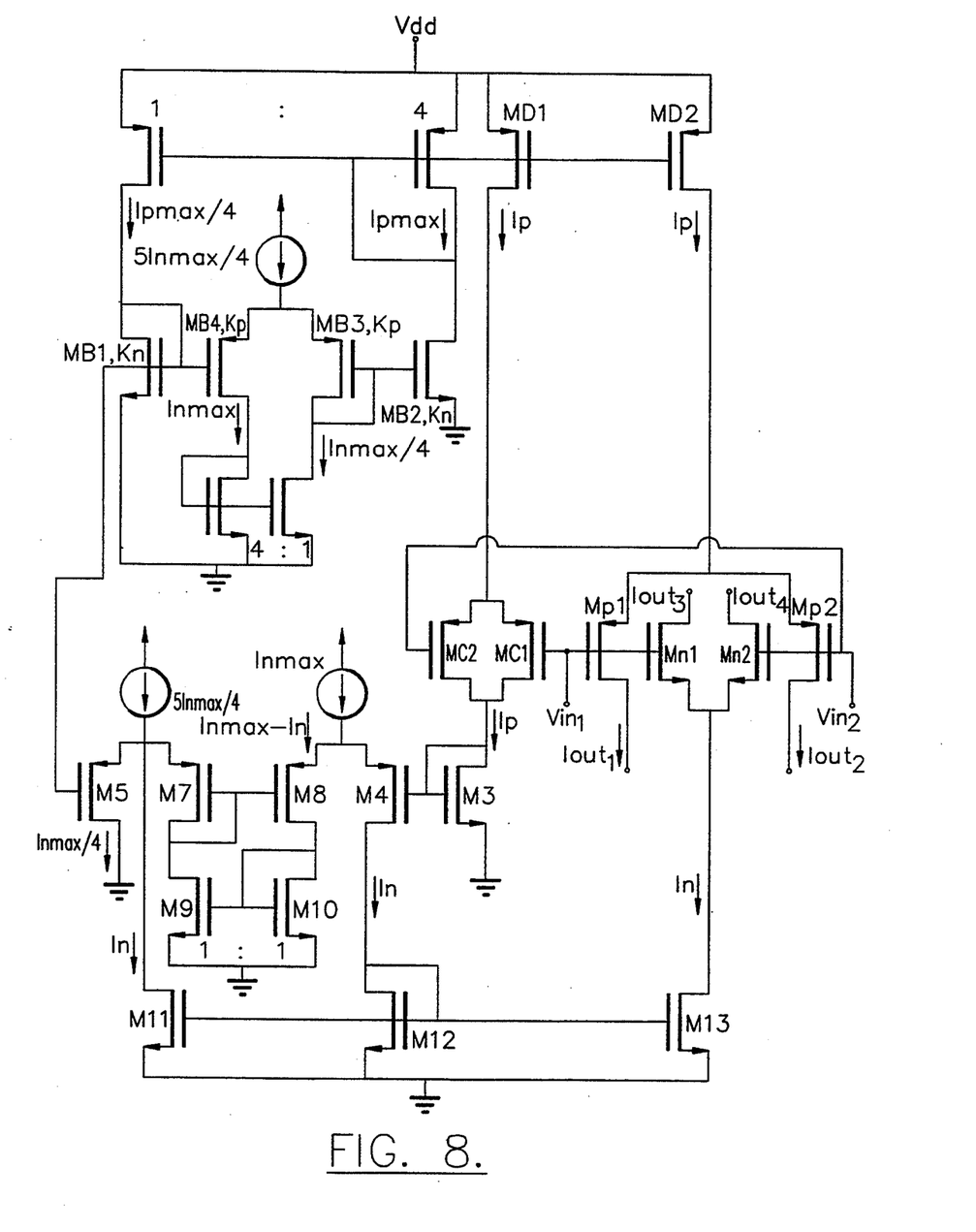
FIG. 8 illustrates a rail-to-rail constant transconductance input stage according to the invention which does not require the matching of n-type and p-type transistors.

An entire input stage with a constant transconductance circuit is shown in FIG. 8. FETs $M_{p1}$ and $M_{p2}$ constitute the p-channel differential pair with a bias current $I_{pmax}$ provided from the circuit consisting of FETs $M_{B1}$ through $M_{B4}$. The FET combination of $M_{C1}$ and $M_{C2}$ sense $I_p$ from $M_{D1}$ and then source $I_p$ into M3 which is a part of the constant transconductance dynamic bias circuit. Since $I_c$ in FIG. 6 equals $I_{pmax}/4$, if "a" in FIG. 7 is chosen to be $\frac{1}{4}$, then the gate voltages of FETs M6 and $M_{B1}$ will be equal. Thus, M6 is eliminated from FIG. 8 and the gate of M5 is connected to the gate of $M_{B1}$.

Operation of the circuit is summarized as follows. A constant current $I_{nmax}$ is sourced into the bias circuit, which produces a constant current $I_{pmax}$. For $V_{in}$ well below $V_{dd}$, $M_{D1}$ and $M_{D2}$ operate in the saturation region, and $M_{C1}$, $M_{C2}$, $M_{p1}$, and $M_{p2}$ receive $I_{pmax}$. Thus, $I_n$ equals zero, and $I_p$ is limited by and equals $I_{pmax}$. Therefore, the transconductance is provided by the p-channel pair of FETs. As $V_{in}$ increases toward $V_{dd}$, $M_{D1}$ and $M_{D2}$ enter the triode region. Consequently, $I_p$ becomes less than $I_{pmax}$ and $I_n$ starts to increase, at which point both input pairs contribute to the total transconductance. As $V_{in}$ is increased even more, $M_{p1}$ and $M_{p2}$ will turn off and $I_p$ becomes zero. Then, $I_n$ is eventually limited by and becomes $I_{nmax}$, at which point only the n-channel pair of FETs provides the transconductance.

Figure 9:
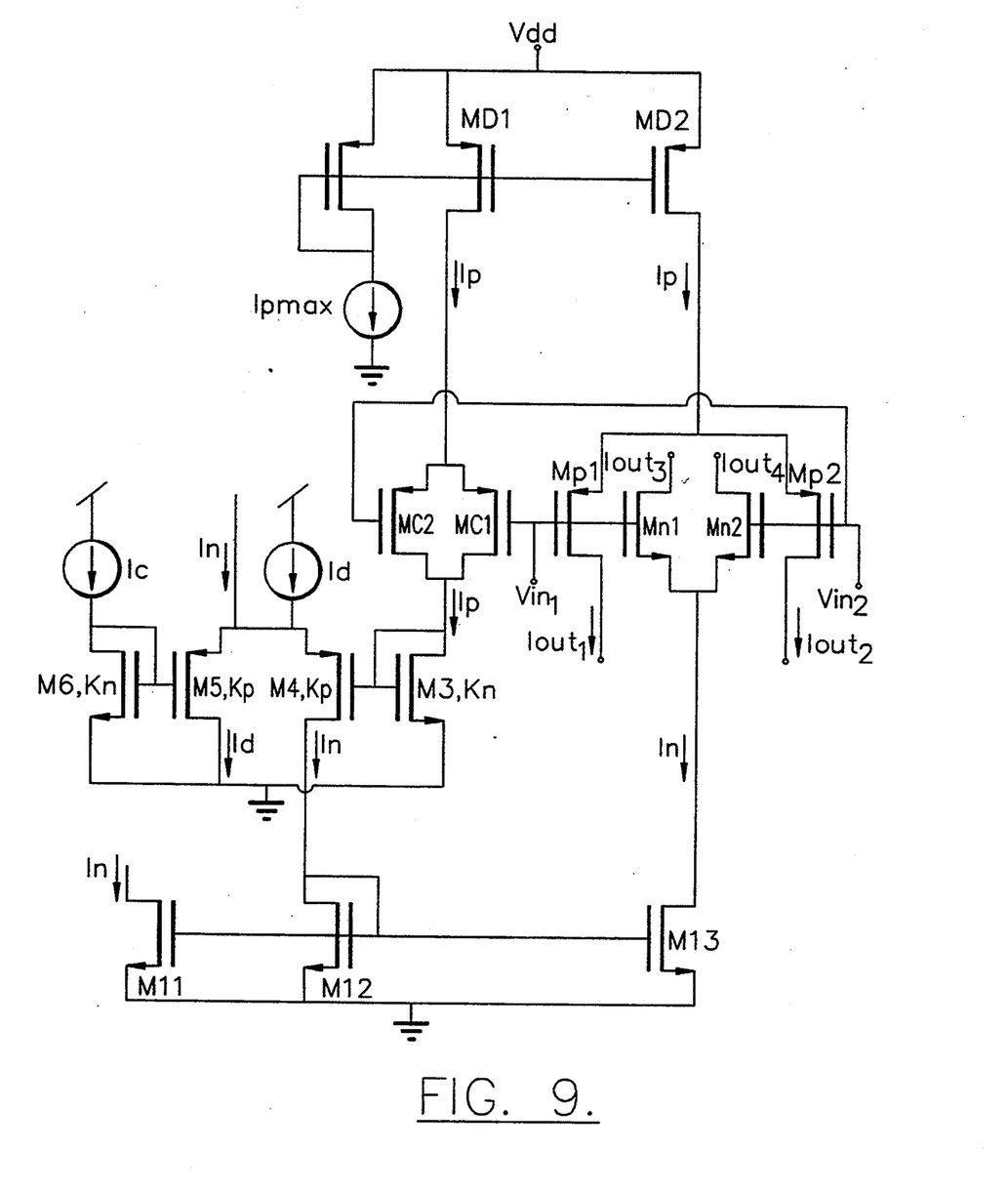
FIG. 9 illustrates a differential input stage designed without consideration for the weak inversion operation of its field effect transistors.
Figure 10:
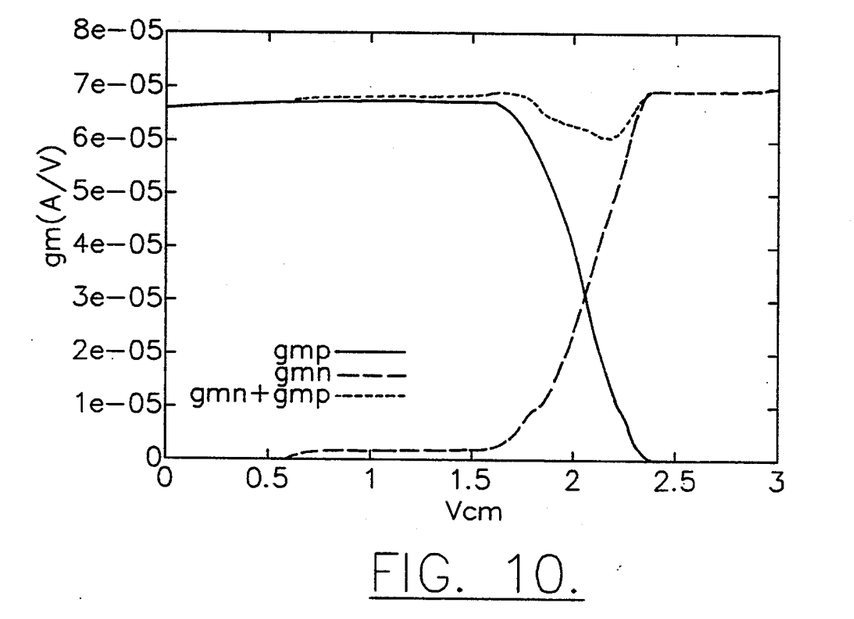
FIG. 10 graphically illustrates a plot of an input transconductance stage according to the invention plotted against a common mode input voltage.

FIG. 9 illustrates a differential input stage designed without consideration for the weak inversion operation of its FETs. In order to obtain a constant transconductance $I_c = I_{pmax}/4$ and $I_d = I_c K_p / K_n$. In other words, $I_d K_n = I_c K_p$, which is similar to equation (11) above.

Simulation Results

Figure 11:
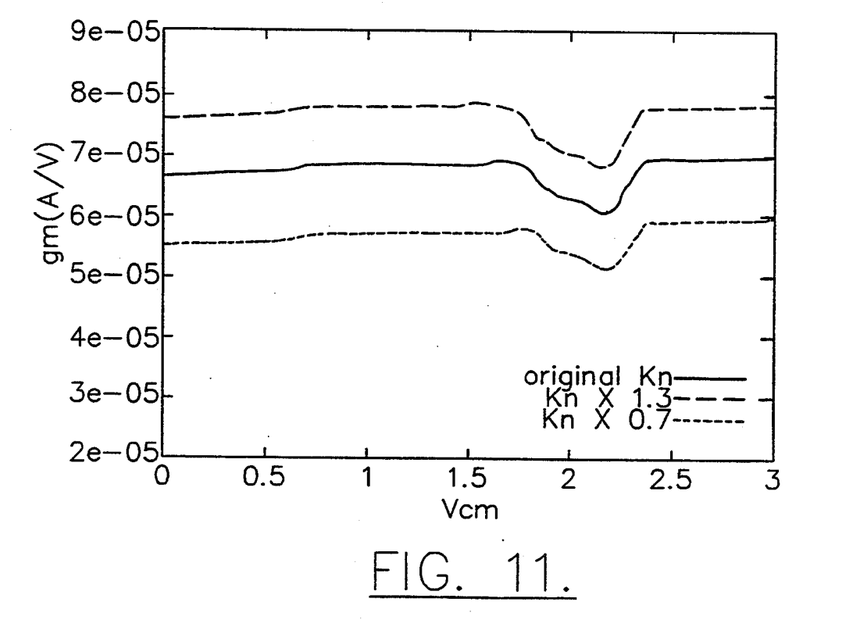
FIG. 11 illustrates a plot of the total transconductance of an input stage according to the invention with different mobility values.

Simulations were performed using the Berkeley Short Channel IGFET Model (BSIM) parameters to maintain the continuity in transconductance between the strong inversion and the weak inversion modes. Parameters are from 2 $\mu$m process and the equivalent $K_n / K_p$ ratio of the same size transistors is approximately 2.5. $V_{dd}$ is set to 3 volts. FIG. 11 shows the total $g_m$ along with $g_{mn}$ and $g_{mp}$ plotted as a function of the input common mode voltage. As shown, $g_{mn}$ starts to increase as soon as $g_{mp}$ starts decreasing. The total $g_m$ is almost constant except in the region between $1.7 < V_{in} < 2.3$ where transistors are switching operation regions between saturation-triode and between strong inversion-weak inversion. Even with the limited transistor model accuracy of the simulation tool, the deviation in the total $g_m$ over the entire common mode voltage is on the order of 10%.

To demonstrate the independence of transistor matching between transistors of opposite types, mobility parameters of the n-type transistors were changed while the mobility parameters of the p-type transistors were left unchanged. FIG. 11 shows that changing $K_n$ by a factor of x results in a $g_m$ change by a factor of $\sqrt{x}$ as expected. The change in $g_m$ is uniform over the entire common mode region and the percentage $g_m$ deviation remain the same.

A conventional bias circuit which attempts to maintain a constant transconductance by matching transistors of opposite conductivity types also must try to take into account the effect of temperature on the circuit. In other words, as the temperature shifts, and the mobility $\mu$ of the transistors then changes, the transconductance of the conventional bias circuit is then further interfered with because the change in mobility changes the matching of the n-channel and p-channel FETs. The effectiveness of the constant $g_m$ bias circuit without the requirements of matching transistors of opposite types is clearly demonstrated.

One skilled in the art would readily appreciate other semiconductor devices incorporating the constant transconductance bias circuits according to the invention. The concept can be applied to any circuit stage which requires rail-to-rail operation with a constant transconductance. An input stage, a linear voltage to current converter, an analog four-quadrant multiplier, and active CMOS resistors are good candidates. Accordingly, many modifications and other embodiments of the invention will come to the mind of one skilled in the art having the benefit of the teachings presented in the foregoing descriptions and the associated drawings. Therefore, it is to be understood that the invention is not to be limited to the specific embodiments disclosed, and that modifications and embodiments are intended to be included within the scope of the appended claims.

What is claimed is:

1. An integrated circuit comprising:
    a differential stage having a first differential pair of Field Effect Transistors (FETs) of a first conductivity type with a first bias current flowing therethrough and a second pair of differential FETs of a second conductivity type, electrically connected in parallel with the first pair of FETs, with a second bias current flowing therethrough; and
    constant transconductance bias means, electrically connected to said differential stage, for monitoring one of the first and second bias currents and dynamically controlling the other of the first and second bias currents to maintain constant transconductance of said differential stage.

2. An integrated circuit according to claim 1 wherein the monitored one of said first and second bias currents is a common mode voltage-dependent current and wherein the associated differential pair of FETs are of p-type conductivity.

3. An integrated circuit according to claim 2 wherein the dynamically controlled one of said first and second bias currents is supplied by said constant transconductance bias means and wherein the associated differential pair of FETs are of n-type conductivity.

4. An integrated circuit according to claim 1 wherein the monitored one of said first and second bias currents is a common mode voltage-dependent current and wherein the associated differential pair of FETs are of n-type conductivity.

5. An integrated circuit according to claim 4 wherein the dynamically controlled one of the first and second bias currents is supplied by said constant transconductance bias means and wherein the associated differential pair of FETs are of p-type conductivity.

6. An integrated circuit according to claim 1 further comprising a first current source, electrically coupled to the constant transconductance bias means, for limiting said dynamically controlled bias current when the FETs through which the monitored bias current flows are operating in weak inversion.

7. An integrated circuit according to claim 6 further comprising a second current source, electrically coupled to the constant transconductance bias means, for limiting said monitored bias current when the FETs through which the dynamically controlled bias current flows are operating in weak inversion.

8. An integrated circuit according to claim 7 wherein the constant transconductance bias means maintains the current ratio of the first current source to the second current source equal to a predetermined constant value.

9. An integrated circuit according to claim 8 wherein said predetermined constant value is equal to the ratio of device transconductance parameter of the FETs through which the monitored bias current flows and device transconductance parameter of the FETs through which the dynamically controlled bias current flows.

10. An integrated circuit according to claim 1 further comprising a constant voltage source, electrically coupled to the constant transconductance bias means, for providing a bias voltage thereto.

11. An integrated circuit according to claim 1 further comprising a constant current source, electrically coupled to the constant transconductance bias means, for providing a bias current thereto.

12. An integrated circuit comprising:

differential input means including a plurality of transistors of a first conductivity type having a first device transconductance parameter and a plurality of transistors of a second conductivity type having a second device transconductance parameter which is different from said first device transconductance parameter, said first and second plurality of transistors defining a first input and a second input for receiving a first and a second input signal and at least one output for providing an output signal which is proportional to the difference between the first and second input signals; and constant transconductance bias means, electrically connected to said differential input means, for dynamically controlling the differential input means to maintain constant transconductance of the differential input means, notwithstanding the different device transconductance parameters of said first and second conductivity transistors.

13. An integrated circuit according to claim 12 further comprising:

a first bias current source and a second bias current source, electrically connected to said differential input means and said constant transconductance bias means, wherein said constant transconductance bias means monitors one of the first and second bias current sources and dynamically controls the other of the first and second bias current sources.

14. A method for operating an integrated circuit, the integrated circuit comprising a differential stage having a first differential pair of Field Effect Transistors (FETs) of a first conductivity type with a first bias current flowing therethrough and a second pair of differential FETs of a second conductivity type, electrically connected in parallel with the first pair of FETs, with a second bias current flowing therethrough, said method comprising the steps of:

monitoring one of the first and second bias currents; and dynamically controlling the other of the first and second bias currents to maintain constant transconductance of the differential stage.

15. A method according claim 14 wherein the monitored one of said first and second bias currents is a common mode voltage-dependent current and wherein the associated differential pair of FETs are of p-type conductivity.

16. A method according to claim 15 wherein the dynamically controlled other of said first and second bias currents is supplied by said constant transconductance bias means and wherein the associated differential pair of FETs are of n-type conductivity.

17. A method according to claim 14 wherein the monitored one of said first and second bias currents is a common mode voltage-dependent current and wherein the associated differential pair of FETs are of n-type conductivity.

18. A method according to claim 17 wherein the dynamically controlled other of the first and second bias currents is supplied by said constant transconductance bias means and wherein the associated differential pair of FETs are of p-type conductivity.

19. A method according to claim 14 further comprising the step of:

limiting said dynamically controlled bias current to a predetermined maximum value when the FETs through which the monitored bias current flows are operating in weak inversion.

20. A method according to claim 19 further comprising the step of:

limiting said monitored bias current to a second predetermined maximum value when the FETs through which the dynamically controlled bias current flows are operating in weak inversion.

21. A method according to claim 20 wherein said dynamically controlling step comprises the step of maintaining a ratio of the first predetermined maximum value to the second predetermined maximum value equal to a predetermined constant value.

22. A method according to claim 21 wherein said predetermined constant value is equal to the ratio of device transconductance parameter of the FETs through which the monitored bias current flows and device transconductance parameter of the FETs through which the dynamically controlled bias current flows.

* * * * *